US005363278A

United States Patent [19]

Komorita et al.

[11] Patent Number: 5,363,278

[45] Date of Patent: Nov. 8, 1994

[54] BONDED CERAMIC-METAL COMPOSITE SUBSTRATE, CIRCUIT BOARD CONSTRUCTED THEREWITH AND METHODS FOR PRODUCTION THEREOF

[75] Inventors: Hiroshi Komorita; Nobuyuki Mizunoya, both of Kanagawa, Japan

[73] Assignee: Kabushiki Kaisha Toshiba, Kawasaki, Japan

[21] Appl. No.: 889,384

[22] Filed: May 28, 1992

Related U.S. Application Data

[62] Division of Ser. No. 324,553, Mar. 16, 1989, Pat. No. 5,155,665.

[30] Foreign Application Priority Data

Mar. 30, 1988 [JP] Japan ................................ 63-077225

[51] Int. Cl.[5] .......................... H05K 1/18; H05K 7/02

[52] U.S. Cl. .................................... 361/762; 174/255; 174/256; 156/87; 361/748; 361/760; 361/807; 361/809

[58] Field of Search ................ 174/255, 256; 228/179, 228/180.2; 361/397, 400, 414, 760, 762, 764, 767, 779, 783, 792, 793, 807, 809, 748, 750; 156/87

[56] References Cited

U.S. PATENT DOCUMENTS

| | | | |
|---|---|---|---|
| 3,716,759 | 2/1973 | Scace et al. | 361/708 |
| 4,409,278 | 10/1983 | Jochym . | |
| 4,985,097 | 1/1991 | Matsumura et al. | 156/87 |

FOREIGN PATENT DOCUMENTS

| | | | |
|---|---|---|---|
| 61-7647 | 1/1986 | Japan | 174/256 |
| 63-301429 | 12/1988 | Japan | 174/255 |
| 2099742A | 12/1982 | United Kingdom . | |

*Primary Examiner*—Leo P. Picard
*Assistant Examiner*—Donald Sparks

[57] ABSTRACT

A bonded ceramic-metal composite substrate comprising a ceramic substrate having opposite surfaces and a copper sheet having a face directly bonded to one of the surfaces of the ceramic substrate, characterized in that the Vickers hardness of the copper sheet lies in the range from 40 kg/mm$^2$ to 100 kg/mm$^2$.

17 Claims, 1 Drawing Sheet

BONDED CERAMIC-METAL COMPOSITE SUBSTRATE, CIRCUIT BOARD CONSTRUCTED THEREWITH AND METHODS FOR PRODUCTION THEREOF

This application is a division of application Ser. No. 07/324,553, now U.S. Pat. No. 5,155,665 filed Mar. 16, 1989.

BACKGROUND OF THE INVENTION

This invention relates to a bonded ceramic-metal composite substrate comprising a copper sheet directly bonded to a ceramic substrate, to a circuit board constructed of such a bonded composite, and to methods for their production.

In recent years, attempts have been made to develop bonded ceramic-metal composite substrates for use in electronic devices. For example, a capacitor element bonded to a ceramic aluminum nitride substrate is disclosed in Scace et al., U.S. Pat. No. 3,716,759. Direct bonding of metal sheets to ceramic substrates is also described in Hill, GB 2,099,742 and Jochym, U.S. Pat. No. 4,409,278, whereby channels are provided in the metal or ceramic substrate in order to avoid blistering by permitting gas escape during the bonding. Some of these attempts have involved disposing a metal sheet such as copper on a ceramic substrate and directly bonding the copper sheet to the substrate by heating at a temperature below the melting point of copper (1083° C.) and above the eutectic point of copper and oxygen (1065° C.).

This kind of composite has several advantages. It provides a strong adhesion between the conductive metal sheet and the ceramic substrate. It also provides a simpler structure which can be easily utilized to obtain a smaller circuit board. And it provides a potentially simpler method for producing a circuit board.

However, in attempting to use ceramic-copper substrates prepared in the foregoing manner in circuit boards for transistor modules, the present inventors found that some of them did not work correctly and others did not work at all. Thus, there is a need for bonded ceramic-copper substrates which will produce more reliable electronic devices.

SUMMARY OF THE INVENTION

This invention was made to solve the foregoing problem. The object of this invention is to provide a bonded ceramic-metal composite substrate comprising a copper sheet directly bonded to a ceramic substrate, a circuit board produced from such a composite substrate which works with a high degree of operational reliability, and methods for production thereof.

This invention is directed to a bonded ceramic-metal composite substrate comprising a ceramic substrate having opposite surfaces and a copper sheet having a face directly bonded to one of the surfaces of the ceramic substrate, wherein the copper sheet has a Vickers hardness in the range of 40 kg/mm$^2$ to 100 kg/mm$^2$.

According to a further aspect of the invention, a circuit board is provided comprising (a) a bonded ceramic-metal composite substrate comprising a ceramic substrate having opposite surfaces and a copper sheet having opposite faces, one face of which is directly bonded to one of the surfaces of the ceramic substrate and the other face of which comprises at least one mounting area and at least one electrode area, wherein the copper sheet has a Vickers hardness in the range of 40 kg/mm$^2$ to 100 kg/mm$^2$; (b) at least one electrical element mounted on said at least one mounting area of the copper sheet, and (c) at least one bonding wire connecting said at least one electrical element with said at least one electrode area.

In accordance with a further aspect of the invention, a method of producing a bonded ceramic-copper composite substrate is provided comprising the steps of applying a copper member to a desired position on the surface of a ceramic substrate and heating the resulting assembly to a temperature below the melting point of copper but above the eutectic temperature of copper and oxygen to directly bond the copper member to the substrate, wherein said copper member is selected to have an initial hardness such that the Vickers hardness of said copper member after said heating step is in the range of 40 kg/mm$^2$ to 100 kg/mm$^2$.

In accordance with yet another aspect of the invention, a method of producing a circuit board is provided comprising the steps of (a) producing a bonded ceramic-metal composite substrate by applying a copper member to a desired position on the surface of a ceramic substrate and heating the resulting assembly to a temperature below the melting point of copper but above the eutectic temperature of copper and oxygen to directly bond the copper member to the substrate, said copper member having a free face comprising at least one mounting area and at least one electrode area, wherein said copper member is selected to have an initial hardness such that the Vickers hardness of said copper member after said heating step is in the range of 40 kg/mm$^2$ to 100 kg/mm$^2$; (b) mounting at least one electrical element on said at least one mounting area of the copper sheet, and (c) electrically connecting a bonding wire to said at least one electrical element and said at least one electrode area.

DETAILED DESCRIPTION OF PREFERRED EMBODIMENTS

Figure 1:
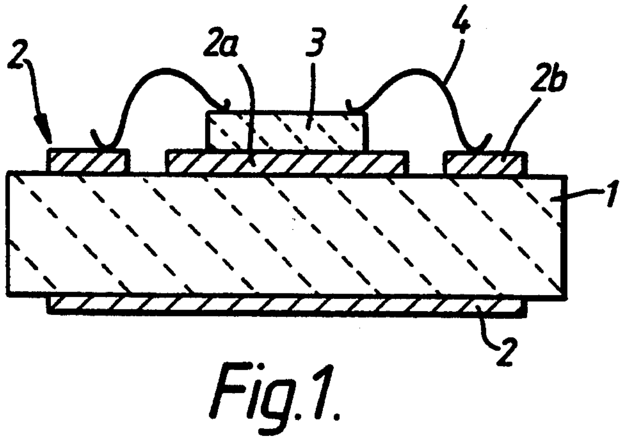
FIG. 1 is a sectional view of the structure of a circuit board according to this invention, showing how a semiconductor element is mounted on the copper sheet.

There are several steps to obtain a circuit board. As seen in FIG. 1, an electronic part 3 is mounted, for example by using solder, on a mounting area 2*a* of a copper sheet 2 bonded to a ceramic sheet 1. This electronic part 3 is electrically connected with one or more terminal electrode areas 2*b* of copper sheet 2 through aluminium wires 4. Finally, the circuit board may be covered with resin (not shown).

A copper sheet may be used which has already been punched out or stamped into a prescribed shape for the desired circuit. Alternatively, a continuous sheet of copper may subsequently be formed into conductor circuits by etching.

Many factors were considered as the cause why bonded ceramic-copper metal circuit boards did not work correctly or did not work at all. The present inventors discovered what the cause was. That is, the adhesion between the copper sheet and the aluminium bonding wire caused the trouble. The present inventors discovered that the wire exhibits excessive elongation around the bonded portion between the copper sheet and the wire, and that this excessive elongation may cause a break in the electrical connection between an electronic part 3 and the terminal electrode *2b* of the copper sheet. The present inventors also discovered that there were some wires whose ends were buried in the copper sheet, and that this burial may cause a break in the electrical connection between the electronic part 3 and the terminal electrode *2b* of the copper sheet.

Ultrasonic bonding (a bonding method using ultrasonic energy) is used for bonding of thin wire. In early attempts to ultrasonically bond a thin aluminium wire to a bonded ceramic-copper circuit board substrate, it was found that the ultrasonic bonding did not work very well. As a result of a lot of experiments, the present inventors discovered that the hardness of the copper sheet was important to solve this problem. That is, it was discovered that a copper sheet whose Vickers hardness was less than 40 $kg/mm^2$ had a tendency to cause the problem that the wire is buried in the copper sheet by ultrasonic energy during ultrasonic bonding, permitting unnecessary elongation of the bonding wire in the region of the joint, causing rupture in the vicinity of the joint. It was also found that a copper sheet whose Vickers hardness was more than 100 $kg/mm^2$ had a tendency to cause the problem that the ultrasonic wave was attenuated during ultrasonic bonding, leading to a decrease in the adhesion. It is particularly preferred that the Vickers hardness of the copper sheet should be in the range of 60 $kg/mm^2$ to 80 $kg/mm^2$.

Copper sheets whose initial Vickers hardness was about 90 $kg/mm^2$ were first used to prepare bonded ceramic-copper substrates. The method of producing this kind of composite substrate, however, includes a step of heating to produce CuO at the bonding interface between the copper sheet and the ceramic substrate. Applicants discovered that the initial Vickers hardness of 90 $kg/mm^2$ was reduced to about 35 $kg/mm^2$ because of the heating step. It had apparently never been noticed before (1) that such a reduction in the hardness of a copper sheet occurs in the method of producing CuO at the bonding interface between the copper sheet and the ceramic sheet; (2) that the reduced hardness of a copper sheet permits unnecessary elongation of the bonding wire in the region of the joint during ultrasonic bonding, and (3) that the reduced hardness of a copper sheet affects the operational reliability of the circuit board.

The hardness of the copper sheet can be controlled by regulating the annealing temperature and the annealing time in the process of finishing a copper ingot to a thin copper sheet, or by regulating the working ratio during rolling of the copper sheet. By choosing appropriate conditions, a copper member of the desired hardness can be obtained. Also, the hardness of the copper member that constitutes the starting material is determined beforehand in accordance with the processing conditions, since the hardness of the copper member is affected by the heat treatment that is used to bond the copper member and ceramic substrate.

It is also desirable that the copper should be rolled so that the oxygen constituting the adhesive at least to the bonding face is contained in a proportion of 100 ppm to 3000 ppm with respect to the copper member that is used. A thickness of the copper sheet in the range of 0.25 mm to 0.6 mm is suitable.

Various types of ceramic substrates can be used as the ceramic substrate in this invention, for example sintered ceramic bodies of the oxide type, such as alumina or beryllia, or ceramic sintered bodies of the non-oxide type, such as aluminium nitride, silicon nitride, titanium nitride, and silicon carbide.

If ceramic substrates of the non-oxide type are used, they are preferably employed after a prior oxidizing treatment of the bonding surface.

The ceramic substrates of this invention are manufactured, for example, as follows:

Specifically using a copper member having the prescribed hardness, a circuit pattern is produced by disposing a copper sheet preformed to the shape of the required circuit pattern, or a copper sheet in the form of a flat sheet, in contact with the ceramic substrate, bonding by heating to a temperature below the melting point of copper (1083° C.) but above the eutectic temperature of copper and oxgen (1065° C.), and if a flat sheet is used, etching the copper sheet as required to produce the required circuit pattern.

If a copper sheet containing oxygen is used as the copper sheet, the atmosphere during heat bonding is preferably an inert gas atmosphere. If a copper sheet not containing oxygen is used, an atmosphere containing 80 ppm to 3900 ppm of oxygen is preferable.

Vickers hardness can be determined as follows. First, a diamond needle having a weight of 100 g is placed on a copper sheet for 30 seconds. A diamond-shaped, hollow depression is thereby formed on the copper sheet. Vickers hardness can be calculated by using the following equations:

$$A=(Aa+Ab)/2$$

$$H=1.8544\cdot W/A^2$$

wherein

Figure 2:
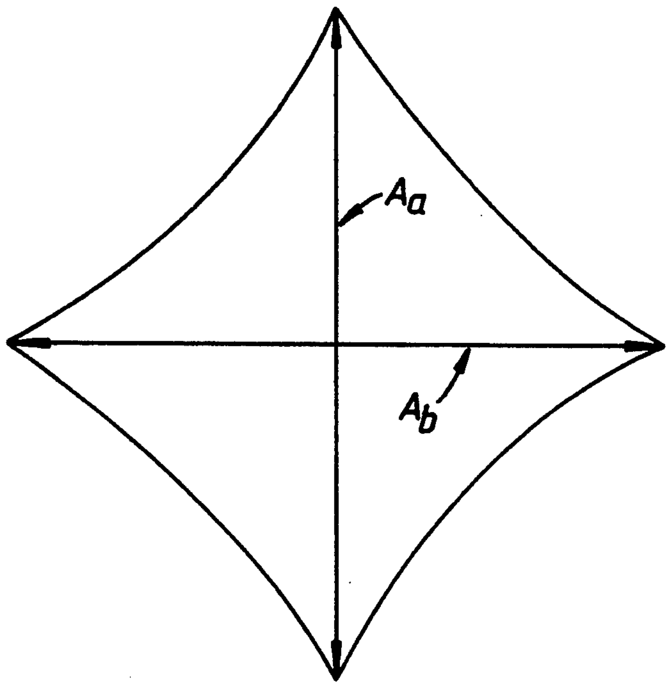
FIG. 2 is a plan view of a hollow made on a copper sheet with a diamond needle in a Vickers hardness test, showing a diagonal line Aa and a diagonal line Ab.

A represents the average length of the diagonal lines calcuated with the length of diagonal line Aa and the length of diagonal line Ab (mm) [FIG. 2]

W represents the needle weight (kg), and

H represents the Vickers hardness ($kg/mm^2$).

Next, the invention will be described with reference to specific examples of preferred embodiments.

First of all, as shown in FIG. 1, respective ceramic substrates were manufactured by respectively arranging both faces of a ceramic substrate 1, of which the main constituent is alumina, (containing 96 wt. % alumina, and 4 wt. % sintering adjuvant components) in contact with respective 0.3 mm thick copper sheets 2 having the initial Vickers hardnesses shown in the following Table, and effecting bonding by heating for 10 minutes at 1075° C. in a nitrogen atmosphere. The subsequent Vickers hardnesses of the bonded copper sheets 2 .in the resulting ceramic circuit substrates were respectively as shown in the following Table. Next, the respective silicon chips 3 were mounted on the bonded ceramic-copper substrates by soldering them to mounting portions *2a* of copper sheets 2 of these ceramic circuit substrates, and respective Al wires 4 were bonded to the electrodes of semiconductor elements 3 and terminal electrodes *2b* of copper sheets 2 by the ultrasonic bonding method. The bonding strength of these Al wires 4 was then determined by a destructive test. The results obtained are shown in the following Table.

TABLE

| Sample No. | Vickers Hardness (kg/mm²) Before Bonding | After Bonding | Bonding Strength (kg/mm²) | Mode of Failure |
|---|---|---|---|---|
| 1 | 100 | 40 | 11 | Rupture in middle of wire |
| 2 | 120 | 60 | 13 | Rupture in middle of wire |
| 3 | 130 | 80 | 13 | Rupture in middle of wire |
| 4 | 150 | 100 | 10 | Rupture in middle of wire |
| C1* | 90 | 35 | 9 | Rupture in area of joint |
| C2* | 160 | 110 | 8 | Exfoliation of wire |

*Comparative Example
Note: When rupture occurred, the bonding strength was evaluated by the peel strength.

In the case of the comparative examples shown in the Table, ceramic circuit substrates and semiconductor modules were manufactured in the same way as in the embodiments of the invention, except that the initial Vickers hardnesses of the copper sheets were chosen so that the subsequent hardnesses of the bonded copper sheets were 35 $kg/mm^2$ and 110 $kg/mm^2$. The bonding strength of the aluminium wire was also measured by destructive testing in the same way.

As is clear from the results of the destructive tests reported in the Table, with the various ceramic circuit substrates of the embodiments according to the present invention, the bonding strength is high and rupture occurred at the middle of the Al wire. It can therefore be seen that firm and stable bonding of the Al wire had taken place. In contrast, in the case of the ceramic circuit substrates according to comparative example 1, in which the hardness of the copper sheet was low, the bonding strength was also low, and rupture occurred in the area of the joint, showing that unnecessary elongation of the Al wire had occurred. Also, in the case of the ceramic substrate of comparative example 2, in which the hardness of the copper circuit sheet was large, exfoliation of the wire occurred, clearly showing that the bonding strength was insufficient.

As described above, to produce a ceramic substrate according to this invention, the hardness of the copper sheet must be selected to have an appropriate value. As a result, a circuit substrate exhibiting improved, stable adhesion between the copper and an aluminium bonding wire can be produced by the action of ultrasonic waves. Consequently, products of excellent reliability are obtained when various electronic devices, such as semiconductor modules, are manufactured using such ceramic/copper substrates.

The foregoing description and examples have been set forth merely to illustrate the invention and are not intended to be limiting. Since modifications of the described embodiments incorporating the spirit and substance of the invention may occur to persons skilled in the art, the scope of the invention should be limited solely with reference to the appended claims and equivalents.

What is claimed is:

1. A bonded ceramic-metal composite substrate comprising a ceramic substrate having opposite surfaces and a copper sheet having a face directly bonded to one of the surfaces of the ceramic substrate, wherein the substrate is a non-oxide type ceramic substrate that has been subjected to an oxidizing treatment of the bonding surface prior to bonding, and the copper sheet has a Vickers hardness after bonding in the range of 40 $kg/mm^2$ to 100 $kg/mm^2$.

2. A bonded ceramic-metal composite substrate according to claim 1, wherein the copper sheet has a Vickers hardness after bonding in the range of 60 $kg/mm^2$ to 80 $kg/mm^2$.

3. A bonded ceramic-metal composite substrate according to claim 1, wherein the copper sheet has an oxygen content in the range of 100 to 3000 ppm.

4. A bonded ceramic-metal composite substrate according to claim 1, wherein the copper sheet has a thickness in the range of 0.25 mm to 0.6 mm.

5. A bonded ceramic-metal composite substrate according to claim 1, wherein said ceramic substrate is a ceramic sintered body of the non-oxide type selected from the group consisting of aluminium nitride, silicon nitride, titanium nitride and silicon carbide.

6. A bonded ceramic-metal composite substrate according to claim 1, wherein said ceramic substrate is aluminium nitride.

7. A bonded ceramic-metal composite substrate according to claim 1, wherein said ceramic substrate is subjected to a prior oxidizing treatment of the bonding surface prior to bonding to said copper sheet.

8. A circuit board comprising:
(a) a bonded ceramic-metal composite substrate comprising a ceramic substrate having opposite surfaces and a copper sheet having opposite faces, one face of which is directly bonded to one of the surfaces of the ceramic substrate and the other face of which comprises at least one mounting area and at least one electrode area, wherein the substrate is a non-oxide type ceramic substrate that has been subjected to an oxidizing treatment of the bonding surface prior to bonding, and the copper sheet has a Vickers hardness after bonding in the range of 40 $kg/mm^2$ to 100 $kg/mm^2$;
(b) at least one electrical element mounted on said at least one mounting area of the copper sheet, and
(c) at least one bonding wire connecting said at least one electrical element with said at least one electrode area.

9. A circuit board according to claim 8, wherein the Vickers hardness after bonding of the copper sheet lies in the range of 60 $kg/mm^2$ to 80 $kg/mm^2$.

10. A circuit board according to claim 8, wherein the copper sheet has an oxygen content in the range of 100 to 3000 ppm.

11. A circuit board according to claim 8, wherein said at least one electrical element is soldered to said at least one mounting area.

12. A circuit board according to claim 8, wherein said copper sheet has a thickness in the range of 0.25 mm to 0.6 mm.

13. A circuit board according to claim 8, wherein said ceramic substrate is aluminium nitride.

14. A bonded ceramic-metal composite substrate comprising a ceramic substrate having opposite surfaces and a copper sheet having a face directly bonded to one of the surfaces of the ceramic substrate, wherein the substrate is a non-oxide type ceramic substrate selected from the group consisting of aluminium nitride, silicon nitride, titanium nitride and silicon carbide that has been subjected to an oxidizing treatment of the bonding surface prior to bonding, and the copper sheet has a Vickers hardness after bonding in the range of 40 $kg/mm^2$ to 100 $kg/mm^2$.

15. A bonded ceramic-metal composite substrate according to claim 14, wherein said ceramic substrate is aluminum nitride.

16. A circuit board comprising:

(a) a bonded ceramic-metal composite substrate comprising a ceramic substrate having opposite surfaces and a copper sheet having opposite faces, one face of which is directly bonded to one of the surfaces of the ceramic substrate and the other face of which comprises at least one mounting area and at least one electrode area, wherein the substrate is a non-oxide type ceramic substrate selected from the group consisting of aluminium nitride, silicon nitride, titanium nitride and silicon carbide that has been subjected to an oxidizing treatment of the bonding surface prior to bonding, and the copper sheet has a Vickers hardness after bonding in the range of 40 $kg/mm^2$ to 100 $kg/mm^2$;

(b) at least one electrical element mounted on said at least one mounting area of the copper sheet, and (c) at least one bonding wire connecting said at least one electrical element with said at least one electrode area.

17. A bonded ceramic-metal composite substrate according to claim 16, wherein said ceramic substrate is aluminum nitride.

* * * * *